United States Patent [19]
Stockmeier

[11] Patent Number: 5,982,031
[45] Date of Patent: Nov. 9, 1999

[54] POWER SEMICONDUCTOR MODULE WITH CLOSED SUBMODULES

[75] Inventor: Thomas Stockmeier, Boniswil, Switzerland

[73] Assignee: Asea Brown Boveri AG, Baden, Switzerland

[21] Appl. No.: 09/102,368

[22] Filed: Jun. 23, 1998

[30] Foreign Application Priority Data

Jun. 23, 1997 [DE] Germany .................. 197 26 534

[51] Int. Cl.$^6$ .................................................. H01L 23/34
[52] U.S. Cl. .................. 257/723; 257/500; 257/718; 257/685; 361/729; 361/731
[58] Field of Search ................. 257/678, 685, 257/690, 688, 693, 694, 687, 150, 151, 177, 181, 182, 180, 700, 719, 714, 715, 718, 707, 721, 500, 501, 502, 723, 726; 361/716, 719, 729, 730, 731, 747

[56] References Cited

U.S. PATENT DOCUMENTS

| | | | |
|---|---|---|---|
| 5,259,781 | 11/1993 | Baumberger et al. | 439/362 |
| 5,488,256 | 1/1996 | Tsunoda | 257/723 |
| 5,559,374 | 9/1996 | Ohta et al. | 257/723 |
| 5,641,976 | 6/1997 | Taguchi et al. | 257/178 |
| 5,705,853 | 1/1998 | Faller et al. | 257/719 |

FOREIGN PATENT DOCUMENTS

| | | |
|---|---|---|
| 0205746 | 2/1990 | European Pat. Off. . |
| 0597144A1 | 5/1994 | European Pat. Off. . |
| 9114516 | 2/1992 | Germany . |
| 4316639C2 | 1/1994 | Germany . |
| 4418426A1 | 11/1995 | Germany . |
| 19529785A1 | 10/1996 | Germany . |
| 19617055C1 | 6/1997 | Germany . |

Primary Examiner—Tom Thomas
Assistant Examiner—Luan Thai
Attorney, Agent, or Firm—Burns, Doane, Swecker & Mathis, L.L.P.

[57] ABSTRACT

The present invention discloses a power semiconductor module 10 having encapsulated submodules 1 which, for example, is suitable for power switches, rectifiers for the like in industrial or traction drives. The submodules 1 have a sandwiched structure made up of a ceramic substrate, one or a few power semiconductor chips and a molybdenum wafer, and are potted in plastic. They are held in plug-in locations 19 on a common baseplate 11 and make contact via a stack arrangement of conductors 12, 14, 18. Retention and contact of the submodules 1 take place reversibly via pressure contacts 15, 16, 20, clamp contacts 21 or the like. Important advantages of the power semiconductor module 10 relate to the simple and easily scaleable structure, improved ability to withstand thermal load cycles, and the robustness and easy interchangeability of the submodules.

8 Claims, 1 Drawing Sheet

POWER SEMICONDUCTOR MODULE WITH CLOSED SUBMODULES

This application claims priority under 35 U.S.C. §§119 and/or No. 197 26 534.0 filed in Germany on Jun. 23, 1997; the entire content of which is hereby incorporated by reference.

BACKGROUND OF THE INVENTION

1. Field of the Invention

The present invention relates to the field of power electronics. It is based on a power semiconductor module having a plurality of submodules according to the preamble of claim 1.

2. Discussion of Background

Power semiconductors for industrial, traction and other applications are often constructed modularly from a plurality of power semiconductor components, such as, for example thyristors, GTOs, MCTs, power diodes, IGBTs or MOSFETs. MOS-controlled semiconductor chips, in particular, can be produced only with relatively small actively controllable surfaces or switching capacities. For this reason, for example for a 1200 A module, 20 IGBTs are typically connected in parallel to form a power semiconductor module.

A power semiconductor module or power circuit of this type is, for example, disclosed by EP-A1-0 597 144. A hybrid power electronic structure is proposed for connecting a plurality of submodules in parallel and for externally connecting them. On a substrate, a submodule carries a plurality, typically 4–6, power semiconductors which are connected together to form a functional unit. On a common support plate, these submodules are mounted together with a stack arrangement of low-induction interconnecting conductor layers with layers of insulator material in between. The support plate is preferably designed as a heat sink. This structure produces a mechanically stable ower semiconductor module which can withstand thermal loading.

The submodules are designed without a housing, in order to simplify contact with the interconnecting conductors. Wire bonding connections are preferably used, but clamp contacts or alternative connections are also possible. To protect the submodules and contacts, it is also proposed to pot the mounted submodules with the power semiconductor module.

This known module structure has considerable disadvantages. The submodules are particularly easy to damage before they are mounted on the support plate. In a functional test, failure of one semiconductor chip leads to loss of the entire submodule. Relatively large ceramic substrates, and therefore also large-area, thermally problematic soldering connections to the support plate, are necessary. The wire bonding connections between the submodules and the interconnecting conductors must be able to withstand significant loading in terms of carrying current and temperature cycles, but this requires a particular outlay and great care during the bonding process. Nevertheless, the wire bonding connections exposed on the power semiconductor module remain very fragile. If they are potted, then it is difficult or impossible to replace a submodule, which means that the entire power semiconductor module needs to be replaced if an individual semiconductor chip is broken. During operation, bonds which become overloaded as a result of the failure of chips may also become detached, strike arcs, melt the substrate and cause dangerous short circuits between the interconnecting conductors and the heat sink.

Power semiconductor modules with a closed housing are, for example, disclosed by German Patent 3669017. They have a relatively complicated structure with a plurality of semiconductor components, internal wiring, external terminal clips, ceramic supports, etc. They are enclosed by a housing, typically made from plastic, with feed-throughs for the terminals, and are potted on the inside with soft gel, hard epoxy or a combination of these.

A housing encapsulation of this type is very expensive to produce and not very reliable. In particular, soft potting compounds do not provide sufficient protection against moisture or corrosion, while hard potting compounds can give out particles in the event of an explosion and cause great damage.

SUMMARY OF THE INVENTION

Accordingly, one object of the invention is to provide a novel, improved power semiconductor module having a plurality of submodules, which is distinguished by a very simple and flexible structure, robustness and easy interchangeability of the submodules, and very good electrical and thermal loading capabilities. This object is achieved according to the invention by the features of claim 1.

The essence of the invention is in fact to make power semiconductor modules from submodules which are distinguished by an encapsulation with external electrodes for one or a few power semiconductors, which can be fastened reversibly on a common baseplate and can reversibly make contact with externally connectable, low-induction conductors.

One illustrative embodiment presents a submodule with an encapsulation which is distinguished by two external electrodes in the form of a metallized substrate and of a metal plate, and by potting made from an electrically insulating compound.

A further illustrative embodiment represents a preferred structure of a power semiconductor module, in which clamp contacts are formed by projections and recesses in a stack arrangement of interconnecting conductors, these contacts holding and making contact with the submodules.

Other illustrative embodiments are given by the ependent claims.

One advantage of the power semiconductor module according to the invention consists in its improved modularity, the ease with which it can be serviced, and the scaleability to higher or lower switching capacities.

A further advantage of the power semiconductor module according to the invention consists in that, in spite of the fact that the submodules are very easy to interchange, very good electrical and thermal coupling of the chips is achieved.

Particular advantages are improved ability to withstand load cycles owing to the pressure contact of the submodules and, in case of a fault, a favorable, low-impedance short circuit behavior.

A further important advantage of the invention consists in that encapsulated submodules can be produced and tested as standard parts, by virtue of which it is possible to reduce material wastage and costs.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
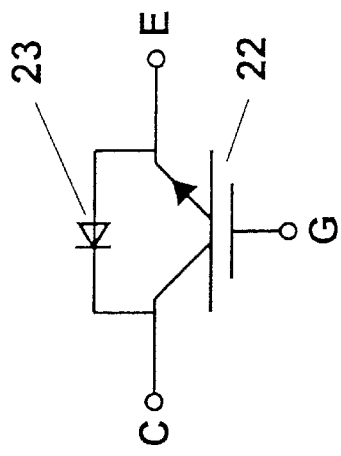
FIG. 1 shows a section through a submodule according to the invention.

Referring now to the drawings, wherein like reference numerals designate identical or corresponding parts throughout the several views, FIG. 1 shows a preferred embodiment of a submodule 1, as constitutes the subject matter of the invention. Using a conventional method, for example DCB (Direct Copper Bonding), a metallization 3 is applied to a ceramic substrate 2. Power semiconductor chips 5a, 5b are soldered together by a power contact C through a solder layer 4 to the metallization 3, and on the opposite surface side by a power contact E through a further solder layer 6 to a molybdenum wafer 7. A control or gate contact G of the chip 5b is connected to a bonding wire 9. Chips 5a and 5b are potted with plastic 8 in such a way that they are enclosed on all sides, or at least substantially, by the ceramic substrate 2, the molybdenum wafer 7 and the potting 8.

By virtue of this encapsulation, the submodule 1 forms a mechanically stable unit which is protected against external influences. Further, a projecting part of the metallized substrate 2, as well as the molybdenum wafer 7, serve as external electrodes 3, 7 for the submodule 1.

Figure 2:
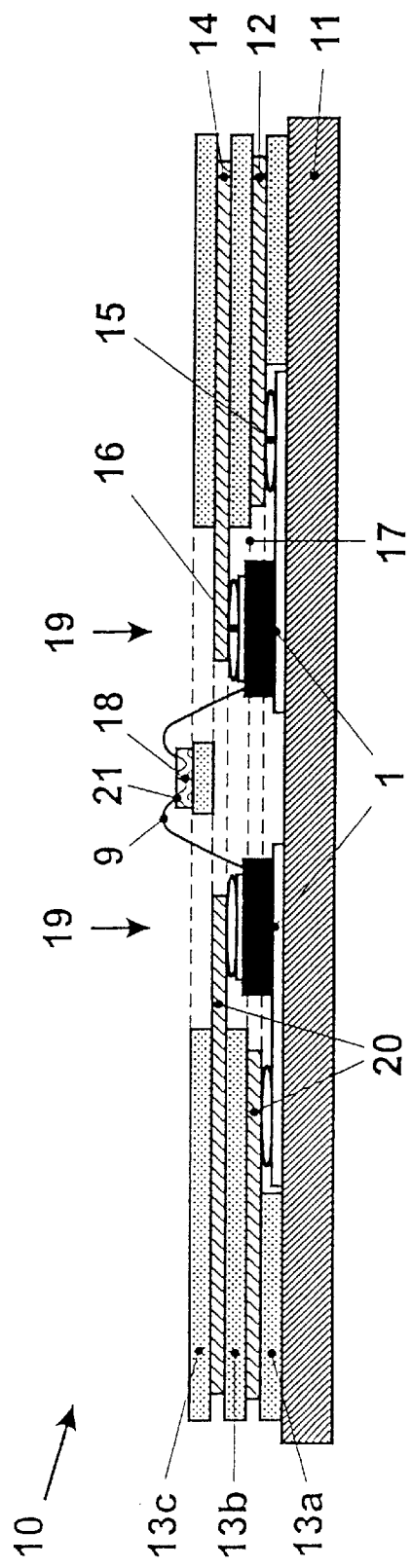
FIG. 2 shows a section through a power semiconductor module according to the invention with submodules according to FIG. 1.

FIG. 2 represents a preferred embodiment of a power semiconductor module with submodules encapsulated in this way. A stack arrangement of two conductors 12, 14, with insulator layers 13a, 13b, 13c in between, is mounted on a baseplate 11. Segments in the stack arrangement are configured as plug-in locations 19 for the submodules 1. Terminal faces 20 for making contact with the external electrodes 3, 7 of the encapsulated submodules 1 are formed by regions of the conductors 12, 14 which project in the form of tongues or are recessed in the form of grooves. The submodules 1 are held via spring contacts 15, 16 on the terminal faces 20. The application pressure provides good thermal contact of the submodules 1, or of their ceramic substrates 2, to the heat-dissipating baseplate 11. The bonding wires 9 are connected via clamp plug contacts 21 to a common gate runner 18, in a symmetrical center position, this gate runner being designed for example as a PCB (Printed Circuit Board).

Figure 3:
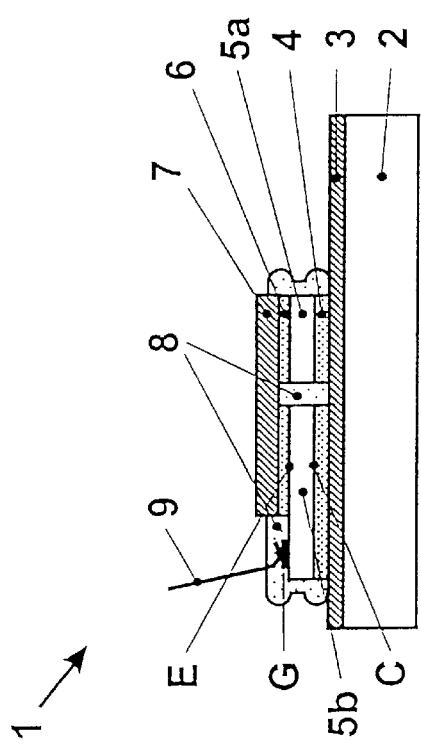
FIG. 3 shows a known circuit diagram of an IGBT with a freewheeling diode of a preferred component complement of a submodule according to FIG. 1.

FIG. 3 shows a known circuit diagram for the interaction of an IGBT 22 with a power semiconductor diode 23. This combination of power semiconductor chips 5a, 5b represents a preferred component complement for an encapsulated submodule 1. In this case, the respective power contacts C, E of both elements, namely the collector and cathode as well as the emitter and anode, are short-circuited and connected to the external electrodes 3 and 7 of the submodules 1.

The invention also comprises further embodiments of the submodules 1 and power semiconductor modules 10, a few of which will be explained in further detail below.

The component complement of a submodule 1 comprises at least one power semiconductor element, such as, for example a thyristor, GTO, MCT, power diode, IGBT or MOSFET, it being possible for the gate contact G, bonding wire 9 and gate runner 18 to be omitted. A submodule 1 may, however, also contain other circuit components. Nevertheless, a submodule 1 should contain only a few elements, in order to keep the advantage of modularity and flexibility. It is particularly desirable to have a minimum component complement, in which full functionality and testability of a submodule 1 is still guaranteed, but the fitting of multiple components to increase the power of a submodule 1 is avoided.

The substrate 2 may consist of any electrically insulating material which has sufficient thermal conductivity, in particular AlN. The wafer 7 may consist of molybdenum, other metals, alloys or other materials with metallic conductivity, so long as the coefficient of thermal expansion is close enough to that of the semiconductor material. Instead of the solder layers 4, 6 and the bonding wires 9, it is also possible to employ other connection techniques, so long as mechanically stable contact with the chips 5a, 5b is achieved. A submodule 1 may also have a plurality of bonding wires 9 and, generally, a plurality of gate terminals 9 for one or more gate contacts G. Instead of using clamp contacts 21, the contact to the gate runner 18 may also be made using jacks or other contacts which are easy to release.

Instead of plastic, the potting 8 may also consist of another electrically insulating potting compound, and is preferably produced by a transfer molding process. In particular, the potting 8 should also protect the bonded gate contact G, and also provide mechanical support for the bonding wire or gate terminal 9 which is fed out. The configuration of the potting 8, and therefore of the submodule 1, is chosen in such a way that it is possible to keep to the specified creepage paths and insulation distances in air or gas. The substrate 2 and the metal plate 7 are components of the submodule encapsulation, and are intended to contribute to the mechanical stability of the encapsulation. It is therefore advantageous if the substrate 2 and the metal plate 7 are chosen with such a large area that they cover a substantial part of the at least one chip 5a, 5b.

It is simplest for the external electrodes 3, 7 formed by the metallization 3 and the metal plate 7 to be of extensive design, but they may also comprise projecting or recessed parts or clips. What is important is that a reliable and readily releasable connection is ensured for heavy currents between the external electrodes 3, 7 and the conductors 12, 14.

The structure of the power semiconductor module 10, may, in particular, be varied in terms of the arrangement of submodules 1 and the stack arrangement of conductors 12, 14. The size and shape of the baseplate 11, the stack arrangement and of the one or more gate runners 18 may be adapted according to the required switching capacity, or number of submodules 1. One or more rows of neighboring plug-in locations 19 for submodules 1 may be provided. Encapsulated plug-in submodules 1 according to the invention may also be combined with known open or permanently mounted submodules. The submodules 1 may also be fastened reversibly by screwing in or in a different way. The stack arrangement may comprise insulator layers 13a, 13b, 13c or solid, air or gas insulation, so long as the separation between the conductors 12, 14 is sufficient. The gate runner 18 may be replaced by a third layer with interconnecting conductors, for example using PCB technology. The interconnecting conductors may extend in planes or be angled off and have clips for the connection of busbars. In this case, especially for submodules 1 with fast-switching chips 5a, 5b such as, for example, IGBTs 22, it is important for the interconnecting conductors 12, 14, and also all the terminals, to be of low-induction design. For pressure contact with the external electrodes 3, 7 of the submodules 1, it is also possible for the terminal faces 20 themselves to be flexibly and resiliently configured, and for the spring contacts 15, 16 to be omitted. Lastly, the baseplate 11 is advantageously designed as a heat sink or is in thermal connection with a heat sink. The heat sink may be built as a ribbed heat sink, as a liquid-cooled heat sink, or the like.

In principle, it is also conceivable to arrange submodules 1 above one another in a plurality of planes to save space, and to make contact through a multilevel stack arrangement of interconnecting conductors 12, 14, in which case it is necessary to guarantee sufficient thermal dissipation, for example via thermal bridges, for each submodule 1.

In addition to the advantages mentioned at the start, power semiconductor modules according to the invention have, in particular, the following merits. After the submodules 1 have been encapsulated, no further bonding or soldering is necessary. In particular, it is no longer necessary to have the solder layer between the large-area ceramic substrates of conventional submodules and the baseplate 11 The dangers due to bonds being detached or solder connections being thermomechanically overloaded are therefore substantially reduced. After the submodules 1 have been mounted in the power semiconductor module 10, it is not necessary to have any further potting, since no components or contacts need to be protected mechanically or electrically. Instead, air insulation 17 is sufficient for the live parts 3, 7, 15, 16, 20 in the region of the plug-in locations 19. On account of the flexible pressure contacts 15, 16, 20, the power semiconductor module 10 according to the invention is distinguished by a very high capacity to withstand thermal load cycles. When semiconductor chips 5a, 5b fail, the corresponding submodules 1 can form a low-impedance short circuit. This reduces the danger of explosion, or at least moderates explosive behavior. Further, a low-impedance short circuit behavior is particularly advantageous when the submodules 1 according to the invention are to be used in series circuits.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by: Letters Patent of the United States is:

1. A power semiconductor module (10) having a plurality of submodules (1), each with an electrically insulating substrate (2) and at least one semiconductor chip (5a, 5b), which submodules (1) are held on a common heat-dissipating baseplate (11) and are in electrical contact with externally connectable conductors (12, 14, 18), wherein
   a) the at least one semiconductor chip (5a, 5b) of a submodule (1) is encapsulated in a housing,
   b) the encapsulation of the submodules (1) comprises the insulating substrate (2) and has external electrodes (3, 7) for power contacts (C, E) of the at least one semiconductor chip (5a, 5b), and
   c) the retention and contacting of each encapsulated submodule (1) on the power semiconductor module (10) are readily releasable.

2. The power semiconductor module as claimed in claim 1, wherein
   a) the encapsulation of the submodules (1) comprises potting (8) made from an electrically insulating compound,
   b) the external electrodes (3, 7) are of extensive design, and
   c) in particular, a gate terminal (9) for a gate contact (G) of the at least one semiconductor chip (5a, 5b) is fed out through the potting (8).

3. The power semiconductor module as claimed in claim 1, wherein
   a) the encapsulation of the submodules (1) further comprises a metal plate (7) and the electrically insulating substrate (2) has a metallization (3),
   b) the at least one semiconductor chip (5a, 5b) is electrically connected via its power contacts (C, E), preferably via solder layers (4, 6), to the metallization (3) and the metal plate (7), and
   c) the external electrodes (3, 7) comprise a projecting part of the metallized substrate (2), and the metal plate (7).

4. The power semiconductor module as claimed in claim 3, wherein
   a) a submodule (1) has a minimum component complement of semiconductor chips (5a, 5b), in particular an IGBT (22) and/or a power diode (23),
   b) the substrate (2) contains a ceramic material,
   c) the metal plate (7) contains molybdenum,
   d) the potting compound (8) consists of plastic, and
   e) a gate terminal (9) is a bonding wire.

5. The power semiconductor module as claimed in claim 1, wherein
   a) the conductors (12, 14) are arranged over the baseplate (11) in a stack, with low induction, and are separated from one another sufficiently for electrical insulation (13a, 13b, 13c, 17),
   b) segments in the stack arrangement with conductor regions projecting in the form of tongues or recessed in the form of grooves are configured as plug-in locations (19) and terminal faces (20) for encapsulated submodules (1), and
   c) in particular, gate contacts of the encapsulated submodules (1) are connected via gate terminals (9) to a gate block (18).

6. The power semiconductor module as claimed in claim 5, wherein
   a) the conductors are separated by solid insulation and, in the region of the plug-in locations, by air or gas insulation,
   b) pressure contact with the external electrodes of the submodules by the terminal faces is provided, and
   c) in particular, the terminal faces are equipped with spring contacts.

7. The power semiconductor module as claimed in claim 3, wherein
   a) the baseplate (11) is designed as a heat sink, or is in thermal connection with a heat sink,
   b) the substrate (2) has high thermal conductivity, and
   c) the submodules (1) can be fastened next to one another with good thermal contact to the baseplate (11).

8. The power semiconductor module as claimed in claim 1, wherein a number of submodules (1) is chosen in accordance with a required switching capacity of the power semiconductor module (10).

* * * * *